US005773882A

United States Patent [19]
Iwasaki

[11] Patent Number: 5,773,882
[45] Date of Patent: Jun. 30, 1998

[54] SEMINCONDUCTOR PACKAGE

[75] Inventor: Hiroshi Iwasaki, Yokohama, Japan

[73] Assignee: Kabushiki Kaisha Toshiba, Kawasaki, Japan

[21] Appl. No.: 802,947

[22] Filed: Feb. 21, 1997

Related U.S. Application Data

[63] Continuation of Ser. No. 427,958, Apr. 26, 1995, abandoned.

[30] Foreign Application Priority Data

Apr. 28, 1994 [JP] Japan ................................. 6-092379

[51] Int. Cl.[6] ............................. H01L 23/48; H01L 23/52
[52] U.S. Cl. .................... 257/692; 257/698; 257/774; 257/778
[58] Field of Search ................................. 257/778, 774, 257/701, 692, 698, 773

[56] References Cited

U.S. PATENT DOCUMENTS

| 4,694,138 | 9/1987 | Oodaira et al. | 219/121 LM |
|---|---|---|---|
| 4,710,798 | 12/1987 | Marcantohio | 357/80 |
| 5,258,648 | 11/1993 | Lin | 257/778 |
| 5,370,759 | 12/1994 | Hakotami et al. | 156/73.1 |
| 5,399,898 | 3/1995 | Rostoker | 257/778 |
| 5,399,903 | 3/1995 | Rostoker et al. | 257/778 |
| 5,461,197 | 10/1995 | Hiruta et al. | 257/778 |

FOREIGN PATENT DOCUMENTS

| 1 226 966 | 9/1987 | Canada . |
|---|---|---|
| 0 159 443 | 10/1985 | European Pat. Off. . |
| 0 520 841 | 12/1992 | European Pat. Off. . |
| 0 570 855 | 11/1993 | European Pat. Off. . |
| 0 644 587 | 3/1995 | European Pat. Off. . |

OTHER PUBLICATIONS

European Search Report, dated Aug. 29, 1995 (including Abstract No. 95302884.2 and Annex).

*Primary Examiner*—Tom Thomas
*Assistant Examiner*—David Ostrowski
*Attorney, Agent, or Firm*—Finnegan, Henderson, Farabow, Garrett & Dunner, L.L.P.

[57] ABSTRACT

The first semiconductor package comprises a board equipped wiped with a wiring circuit including a connection on a main surface, a semiconductor chip mounted face down having input/output terminal corresponding to the connection of the board, flat external connector terminals leading to and are exposed on the other main surface of the board, and filled via hole connection to be electrically connected to the wiring circuit through a filled via hole installed right above each external connector terminal. Further, the second semiconductor package utilizes the above-described construction but the flat external connector terminals are led to and exposed on the other main surface of the board in a constant-pitch lattice-array.

4 Claims, 3 Drawing Sheets

SEMINCONDUCTOR PACKAGE

This is a continuation of application Ser. No. 08/427,958, filed Apr. 26, 1995 now abandoned.

BACKGROUND OF THE INVENTION

1. Field of the Invention

This invention relates to a semiconductor package. More specifically, this invention relates to a compact and thin semiconductor package suitable for card-type external memory media.

2. Description of the Related Art

Since the construction of a memory card is restricted by such factors as its size and thickness, thinness in semiconductor packages is called for. At the same time, it is also desirable for the semiconductor package to be just as big as the semiconductor chip, and to be as compact as possible.

Some well-known methods used to meet the demand for compact mounting on such card structures, for instance, the need to mount against the thickness of the board in a space no more than 1 millimeter deep, are the conventional flip chip mounting method and the COB (Chip on Board) method. Further, a well-known construction of thin semiconductor packages is shown in FIG. 1 which is a cross sectional view of the principal mechanism. In FIG. 1, reference numeral 1 represents a board equipped with wiring circuit 1a including a connection on a main surface thereof; reference numeral 2 indicates a semiconductor chip (flip chip) mounted on a main surface of the board. Reference numeral 4 indicates external connector terminals leading to the other main surface of the board 1 via a through-hole (through-hole connection) 3 while reference numeral 5 indicates a resin layer which seals the region between the semiconductor chip 2 and a main surface of the board 1. In this example, the board 1 uses alumina, aluminum nitride, or glass/epoxy resins as insulators. Moreover, reference numeral 1b in FIG. 1 represents a silver paste connector pad on the connecting surface of the wiring circuit 1a whereas 2a indicates a connector bump installed on the electrode terminal surface of the semiconductor chip 2.

However, said flip chip mounted type semiconductor package has several disadvantages:

Firstly, acquiring KGD (Known Good Die) is a problem with said flip chip mounting and COB methods. That is, burn-in is difficult to develop in chip state and since burn-in for the semiconductor chip to be used is usually not possible to conduct beforehand, there will be problems in terms of reliability. In other words, it is not possible to perform burn-in on this type of minute semiconductor chip, although in the near future it may be possible for the chip itself to detect defects on its own. As such, at the practical initial stage after mounting and modularization, the possibility of trouble is hidden and reliability becomes questionable. Furthermore, in terms of compacting, the COB method requires a larger mounting area compared to the flip chip mounting method thereby hindering attempts at compacting.

Secondly, in the case of said semiconductor packages wherein one face is molded, for instance, when mounting on a base board, there is also danger of unwanted shorting between the wiring patterns in the external connector terminals 4 which lead to the other main surface (back side). To explain further, in a construction wherein the external connector terminals 4 lead to the other main surface (back side) via the through-hole 3, electrical connections to the external connector terminals 4 are established at the periphery of the opening of said through-hole 3. Owing to this, intentions may easily form in the vicinity of the through-hole opening of each external connector terminal 4 (i.e., the center of the external connector terminal 4) such that a level surface may not be fully achieved. Accordingly, when mounting on card-type base boards, reliability of electrical connections may be compromised. considering these matters, a construction wherein the through-hole 3 connections are formed by adjoining (and shifting the positions of) the external connector terminals 4 to ensure a flat surface is being employed. This construction not only restricts the design and layout of the external connector terminals 4 because wiring for connections is done at the back side, but also poses a problem in terms of reliability because ensuring insulation among the external connector terminals is difficult.

SUMMARY OF THE INVENTION

Accordingly, it is an object of this invention to provide a semiconductor package wherein compacting is possible and high reliability may be ensured.

It is a further object of this invention to provide a semiconductor package which can be produced at low cost and wherein high reliability may be ensured.

It is yet another object of this invention to provide a semiconductor package which is compact, highly reliable and suitable for mounting or attaching to cards.

The first semiconductor package related to this invention comprises a board equipped with a wiring circuit including a connection on a main surface, a semiconductor chip mounted face down wherein input/output terminals have been adapted to the connection of said board, flat external connector terminals leading to and are exposed on the other main surface of said board, and a filled via hole connection electrically connected to said wiring circuit through a filled via hole installed right above each said external connector terminal.

The second semiconductor package related to this invention comprises a board equipped with a wiring circuit including a connection on a main surface, a semiconductor chip mounted face down wherein input/output terminals have been adapted to the connection of said board, flat external connector terminals leading to and are exposed on the other main surface of said board in a constant-pitch lattice-array, and a filled via hole connection electrically connected to said wiring circuit through a filled via hole installed right above each said external connector terminal.

Further, the third semiconductor package related to this invention has the same construction as that of said semiconductor packages related to the first and second inventions but wherein the wiring circuit including the connection has been formed and laid out to be almost uniformly leveled against the surface of the board.

To wit, this invention employs the following basic construction:

(a) A main surface of the board is not merely used as a face down mounting region for the semiconductor chip but the available space aside from the connection to which the input/output terminals of the semiconductor chip are connected is utilized for installing wiring circuits.

(b) only flat external connector terminals are led to and exposed on the other main surface (back side) of said board, that is, in a constant-pitch lattice-array.

(c) The wiring circuit on a main surface is connected to said external connector terminals through the filled via hole which is installed right above each external connector terminal.

(d) Further, the surface of the wiring circuit on a main surface of said board is formed and laid out to be as uniformly level as the board surface thereby making it easier to form and place the fine sealing resin layer between the semiconductor chip and the board surface, and while aiming for compactness and thinness in the semiconductor package, improvement in reliability is the key point.

For the purposes of this invention, resin type or ceramic type boards equipped with wiring circuit including a connection on a main surface are used. The boards, for instance, as shown in the plan view of the form of a main surface of board 6 in FIG. 2, are provided with connection pads 6a adapted to the input/output terminals of the semiconductor chip to be mounted. There is also circuit wires 6b, one end of each such circuit wire 6b being electrically connected to one of said connection pads 6a; the other end of each wiring circuit 6b is a connection end connected to the back side (other main surface) of the circuit board 6 through a filled via hole (filled via hole connection) 7 installed right above the flat external connector terminals brought out and laid out preferably in a constant-pitch lattice-array. FIG. 3 is a plan view of the form of the back side of the board 6 wherein only external connector terminals 8 are brought out and laid out in a constant-pitch lattice-array. Here, the arrangement of flat external connector terminals 8 leading to and are exposed on the back side of the board 6 is not particularly limited; however, when arranged in said constant-pitch lattice-array, this type of semiconductor package can be standardized. Further, when the arrangement of said external connector terminals 8 is unbalanced, by installing dummy connector terminals 8' on a corner as shown in FIG. 4, planar installation of semiconductor packages will be easier to perform. It must be noted that since only flat external connector terminals 8 are led to and exposed on the back side of board 6, i.e., there is no through-hole connection nor wiring circuit, it is not only easier to ensure insulation among the flat external connector terminals 8 but also easier to select the arrangement of flat external connector terminals 8.

In the present invention, when installing (by burying) the circuit wires 6b including the connection pads 6a of the board surface of the semiconductor to be mounted such that it is on the same level (flat) as the surface of circuit board 6, the flatness (level) is not necessarily precise; generally, if the thickness of the circuit wires 6b is about 35/um, +/−10/um is tolerated. Further, when ceramic type insulating material is used, said board 6 may be fabricated with the green sheet method whereas if the insulating material is resin type, the prepreg method may be used.

Further, in constructing said board 6, aside from the circuit wires 6b including the connection pads 6a formed on a main surface of the board 6 and/or the in-layer wiring circuit in board 6, a dummy wiring pattern (say at least 0.5 mm in width) may be installed in the non-circuited region in the outer edges by enclosing said wiring circuits and electrically insulating and isolating them. In other words, installing a dummy wiring pattern will suppress and prevent the formation of warps and at the same time allow for noise control. This dummy wiring pattern should be positioned in a region no more than 2 mm away from the outer edges, i.e., as close as possible to the outer edges.

The first semiconductor package related to this invention is equipped with circuit wires 6b including connection pads 6a on a main surface of the board 6. Not only does a main surface of the board 6 function as connection for the input/output terminals of the semiconductor chip but the region which will not interfere with the mounting of the semiconductor chip may also function to accommodate circuit wires 6b extending to remote flat external connector terminals 8 exposed on the back side. As described above, said flat external connector terminals 8 and the circuit wires 6b on a main surface of the board are connected together through filled via hole 7 which are installed right on top of each external connector terminal 8 such that wiring at the back side is eliminated. Consequently, while the arrangement and installation of flat external connector terminals 8 are simplified, in-layer wiring can also be omitted Further, a main surface of this wiring circuit 6b is buried, and since the surface of circuit wires 6b is practically on the same level as the surface of other boards such that flatness is maintained, the fineness of the filling/sealing resin layer is ensured in this region. In other words, since the space between the semiconductor chip and board surfaces is flat and can also be easily filled with resin, a fine sealing layer without void is formed and maintained thereby forming a highly reliable junction.

Yet further, in the case of the second semiconductor package related to this invention, if the construction of said first semiconductor package were designed such that when flat external connector terminals 8 lead to and are exposed on the other main surface of board 6 in a constant-pitch lattice-array, the connection of semiconductor sockets or mounting circuit boards can be standardized. Consequently, mounting productivity can be improved and cost can be lowered for mounting circuit boards; moreover, installing dummy connector terminals 8' will not only make level alignment/attachment easier but also ensure electrical connection.

The foregoing and other objects, features, and advantages of this invention will become apparent from the following detailed description of preferred embodiments of this invention, as illustrated in the accompanying drawings.

BRIEF DESCRIPTION OF THE DRAWINGS

A better understanding of the invention may be had from a consideration of the detailed description hereinafter taken in conjunction with the following drawings.

Figure 1:
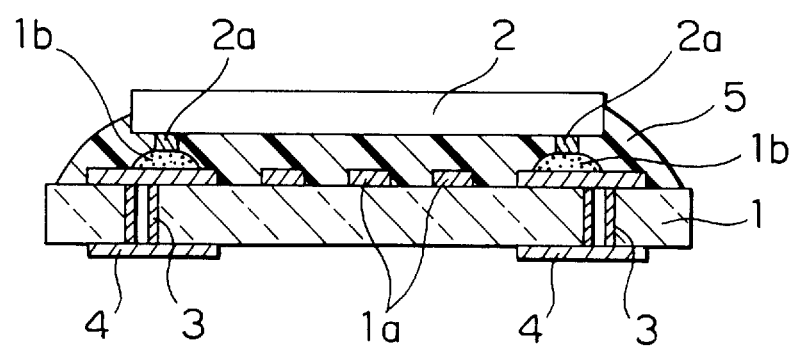
FIG. 1 shows a cross section of a sample principal construction of a conventional compact semiconductor package.
Figure 2:
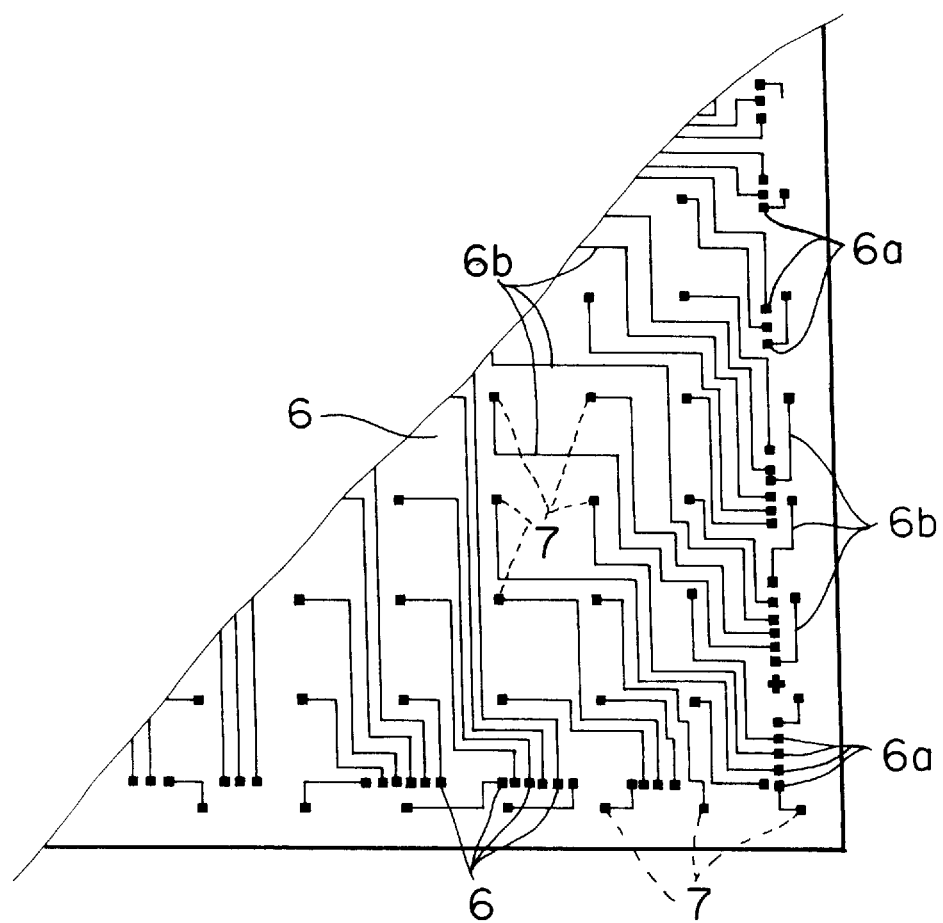
FIG. 2 is a plan view of a sample wiring circuit on a main surface of a board used in the construction of the semiconductor package related to the present invention.

By way of introduction of the illustrated embodiment, the components shown in figures have been assigned general reference numerals and a description of each such component is given in the following detailed description.

DESCRIPTION OF THE PREFERRED EMBODIMENTS

Two preferred embodiments of the present invention are described in detail hereinafter.

Preferred Embodiment 1

Figure 3:
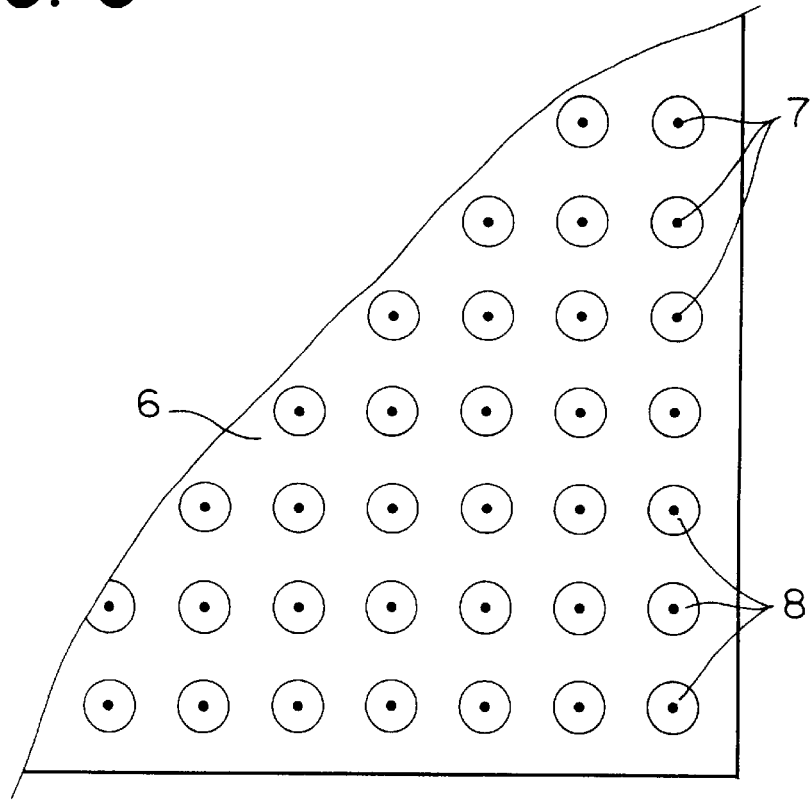
FIG. 3 is a plan view of a sample arrangement of external connector terminals on the other main surface of a board used in the construction of the semiconductor package related to the present invention.
Figure 4:
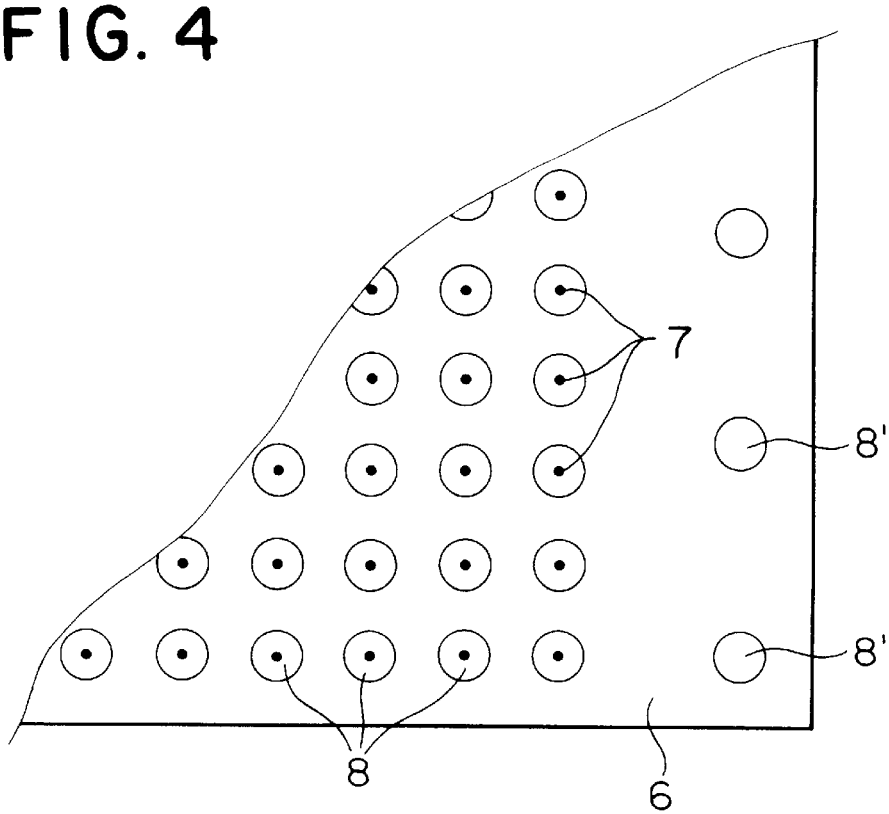
FIG. 4 is a plan view of a sample arrangement of external connector terminals of other boards used in the construction of the semiconductor package related to the present invention.
Figure 5:
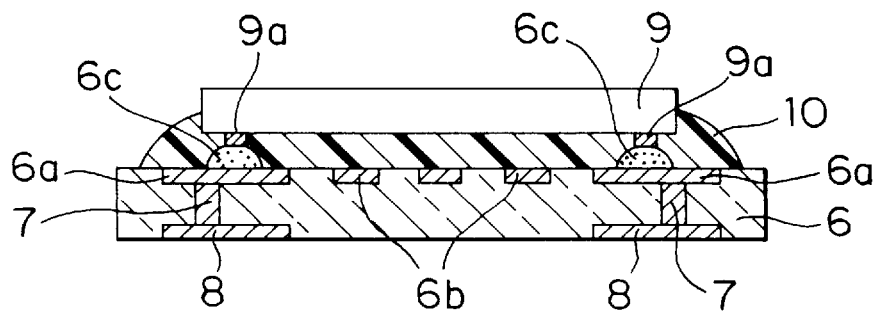
FIG. 5 is a cross section of a sample principal construction of the semiconductor package related to the present invention.

FIG. 5 is a cross section of a sample principal construction of the semiconductor package related to the present invention. In FIG. 5, reference numeral 6 represents a 15 mm long, 15 mm wide and 0.2–0.3 mm thick board equipped with circuit wires 6b including connection pads 6a on a main surface while reference numeral 9 indicates a 13 mm long, 13 mm wide and 0.3 mm thick semiconductor chip (e.g., IC chip). In this figure, a buried type of construction is employed wherein the circuit wires 6b formed on a main surface of said board are on the same level as the main surface of board 6. Further, on the surface of the connection pads 6a of said board 6, a connecting pad 6c made from silver paste is installed to accommodate the connector bump 9a which is positioned on the electrode terminal of semiconductor chip 9. Still further, flat external connector terminals 8 lead to and are exposed on the back side (other main surface) right below each filled via hole, through each filled via hole connection 7 which is electrically connected to the circuit wires 6b on a main surface of said board 6. External connector terminals 8 are arranged in a constant-pitch lattice-array as shown in FIG. 3.

The board 6 having this type of construction may be manufactured in the following manner. Prepare an alumina type green sheet and install filled via hole connecting holes in the position of said green sheet. On a main surface of the green sheet, mold the conductive paste by printing and drying the required circuit wires 6b including the connection pads 6a. Meanwhile, on the other main surface of said green sheet, mold the conductive paste by printing and drying the external connector terminals to which the filled via hole connecting holes are to be directly coupled. Note that in the printing process for said circuit wires 6b or external connector terminals, the filled via hole connecting holes are filled inside with conductive paste to electrically connect the connection end corresponding circuit wires and external connector terminals. Alumina type board 6 is then produced by molding into the required dimensions after baking the compressed alumina type green sheet to which said printing and wiring have been done.

Still further, reference numeral 10 indicates the resin layer which fills and seals the gap between semiconductor chip 9 (which has been mounted on a main surface of board 6) and the surface of board 6.

Figure 6:
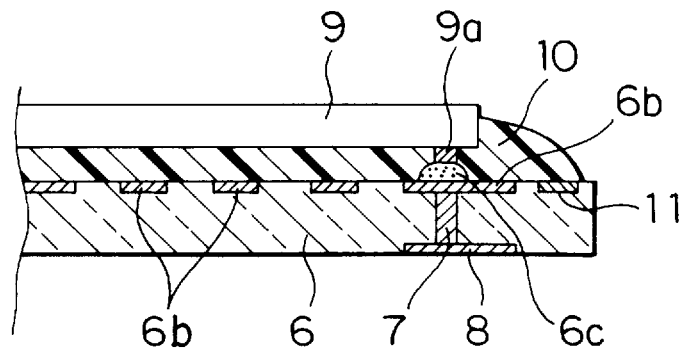
FIG. 6 is a cross section of another example of principal construction of the semiconductor package related to the present invention.

It must be noted that aside from said alumina type board, other types such as aluminum nitride, glass/epoxy resin, or butylene terephthalate resin type of boards are generally used. Further, as shown in FIG. 6 which is a cross section of the principal construction of board 6, a beta-type patterned dummy wiring pattern 11 may be installed in the outer edges (preferably within approximately 2 mm from the outer edge surface) of the main surface of board 6.

A manufacturing example of a semiconductor having said construction is described below.

First, prepare an alumina type board 6 which has a wiring circuit wires 6b including connection pads 6a for flip chip mounting on one surface (a main surface) and a solid type wiring pattern 11 to the surrounding part, and wherein flat external connector terminals 8 lead to and are exposed in a constant-pitch lattice array fashion on the back side (other main surface), right below the filled via holes 7 which are to be connected to the ends of circuit wires 6b. The alumina type board 6 described here is made with the green sheet technique opposite the connection pads 6a. Circuit wires 6b including said connection pads 6a, and flat external connectors 8 are buried such that they are as flat (of the same level) as the alumina type board 6 surface. The diameter of the external connector terminal 8 is 0.5 mm, the pitch between electrode terminals 8 is 1 mm, the diameter of the filled via hole 7 is 50–150/um, while the width and pitch of circuit wires 6b is 50–100/um and 100–200/um, respectively. Moreover, this alumina type board 6 is 15 mm long, 15 mm wide, and 0.2–0.3 mm thick; it is for face down mounting of a 13 mm long, 0.3 mm wide, and 0.3 mm thick semiconductor chip 9.

The alumina type board 6 may then be fixed on the stage of a screen printer which has a vacuum suction mechanism; connecting pad 6c may be formed on the connection of alumina type board 6 which corresponds to the electrode (connecting) pad of said semiconductor chip 9. For example, using a metal mask with say, 150×150/um opening to accommodate the electrode pad (e.g., 100×100/um) 9a of semiconductor chip 9, silver paste (e.g., silver particle diameter 1 um and paste viscosity 100 ps) is screen printed on a main surface of alumina type board 6 to mold, on the surface for connection, a connecting pad 6c which has a diameter of 150 um and is approximately 80/um high.

On the other hand, for the semiconductor chip 9, use a connecting gold bump 9a formed through electric plating on the electrode terminal surface or a gold ball bump (e.g., 30/um high, 100×100/um) 9a formed through ball bonding method.

Next, on a main surface of said alumina type board 6, align and position the connecting pad 6c and connecting gold bump 9a which mutually accommodates said semiconductor chip 9, and by pressurizing the connecting parts together, fix (by burying and applying pressure) and connect at least the tip of the connector bump 9a to the connecting pad 6c to assemble a semiconductor package. In this condition, flip chip bonding is done by heat curing the silver paste comprising said connecting pad 6c.

The process using the sealing resin then follows. In other words, after dropping some sealing resin (e.g., low viscosity epoxy resin) on one edge of the exposed region of the surrounding area of said alumina type board 6, the resin is warmed at 60°–80° C.; the gap between the lower surface of semiconductor chip 9 and upper surface of the alumina type board 6 is poured and filled with sealing resin, utilizing the capillary phenomenon from one edge of the gap. In this resin process, it is advisable that the gap be sufficiently filled with resin 10 and that some resin be allowed to flow along the sides of semiconductor 9. As such, after conducting the necessary resin process, by thermally hardening said resin used to fill the gap, a semiconductor package which employs a construction such as the one cross-sectionally shown in said FIG. 5 is achieved.

Here, fixing of the semiconductor chip 9 against the alumina type board 6 is not only improved by filling with said resin layer 10 but it is also insulated and protected against the surface of the alumina type board 6. On the other hand, although the top of semiconductor chip 9 is exposed, the surface is protected because the silicon material of the exposed surface is fine and hard, thereby confirming also that there will be no problems on reliability concerning this matter.

Further, since the surrounding part of said semiconductor chip 9 is surely and finely resin-sealed, strong coupling with alumina type board 6 is also assured, and the structure functions as a highly reliable semiconductor package. Moreover, it has been recognized that when the solid type dummy wiring pattern 11 is formed and placed on the outer edges of a main surface of board 6, this semiconductor package had the following effects. Through the reinforcing action of dummy wiring pattern 11, formation of breaks and warps is effectively controlled in spite of the fact that the board is merely 0.2 mm thin; while increasing yield, handling work was also simple. In addition, it was also confirmed that when this semiconductor package was used as a functioning part of a memory card, noise control is also good.

Note that although the above-described construction uses a square alumina type board, a rectangular one will also do.

Preferred Embodiment 2

Figure 7:
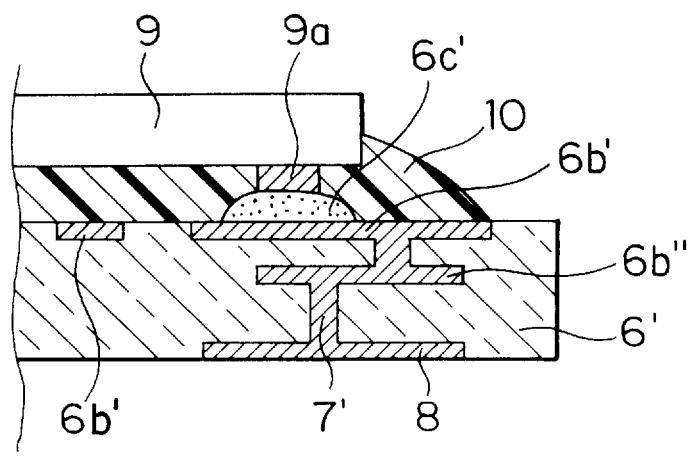
FIG. 7 is a cross section of yet another example of principal construction of the semiconductor package related to the present invention.

A circuit board 6' the construction of which is cross-sectionally shown in FIG. 7 was prepared. On a main surface, it has a wiring circuit 6b' to which connection pads 6a' for flip chip mounting have been installed; through the via hole 7' between the circuit wires 6b', flat external connector terminals 8 lead to and positioned in a constant-pitch lattice-array at the back side (other main surface). In other words, this time the construction is such that the alumina type board 6' has an additional in-layer wiring layer 6b" and filled via hole 7' passes through this in-layer wiring layer 6" before it is connected. However, this board 6' also employs a construction wherein circuit wires 6b' including connection pads 6a' and flat external connector terminals 8 are buried so that they are almost in the same level as the surface of the circuit board 6'. On the other hand, as for the semiconductor chip (flip chip) 9, a connecting gold bump (30/um high, 100×100/um big) for the electrode terminal surface is installed on the electrode pad surface using electric plating method (or ball bonding method).

The alumina type board 6' and flip chip 9 are aligned and positioned on the stage surface of the flip chip bonder. In other words, the alumina type board 6' is vacuum suctioned and then, after aligning and positioning the gold bump 9a (which was formed on the electrode surface of flip chip 9) on the gold connecting pad of alumina board 6', in order to glue the connecting parts of connecting pad 6c and gold bump 9a, they are heated to about 350°–450° C. from the top of flip chip 9 and/or the alumina type board 6', thereby coupling and integrating said connecting pad 6c' and gold pad through mutual dispersion. The space between alumina type board 6' and flip chip 9 was then filled with sealing resin 10 under the same conditions described in the above Preferred Embodiment 1. During said resin-filling process, capillary action was promoted when the temperature was suitably raised, making the filling process easier to perform. After conducting the necessary resin-filling process, the heating process was done to harden said resin filling thereby completing a semiconductor package wherein flip chip 9 has been fixed and secured on the alumina type board 6'.

However, in the above-described construction, the flat external connector terminals 8 brought out and positioned at the back side of board 6' may be in a random arrangement but a constant-pitch lattice-array arrangement is desirable in terms of standardization; further, in the case of a construction with a comparatively big outer margin, dummy external terminals may be installed outside, on each corner of the required flat external connector terminals 8.

From the above description it will be apparent that there is thus provided a device of the character described possessing the particular features of advantage before enumerated as desirable, but which obviously is susceptible to modifications such as in its form, method, mechanization, operation, detailed construction, and arrangements of parts.

As has been explained above, the semiconductor package related to this invention is not only utilized as connecting face for the semiconductor chip to be mounted on the board; it is also utilized as wiring circuit face for connecting to the external connector terminals leading to and are exposed on the back side. By employing a construction which utilizes the board face more effectively, compacting of semiconductor packages is made easier while at the same time, when said connection including a wiring circuit is buried in the board to maintain flatness, the fineness of the sealing resin layer that fills and seals this region is also ensured.

Particularly, since only external connector terminals lead to and are exposed on the back side, the required insulation can easily be established even when mounting on a base board. In other words, on the back surface of the board, without the wiring pattern, a mutually insulated condition is established and only external connector terminals lead to and are exposed. Because of this, electrical insulation between the external connector terminals as well as between the external connector terminals and the base board can surely be established thereby making it possible to form a highly reliable mounting circuit.

Since reliability is easy to establish and compacting is also possible with the semiconductor package related to this invention, when coupled with features such as detachability, it can be said to be quite suitable for use in memory cards.

While in order to comply with the statute, the invention has been described in language more or less specific as to structural features shown, but the means, method and construction herein disclosed comprise the preferred form of several modes of putting the invention into effect and the invention is therefore claimed in any of its forms or modifications within the legitimate and valid scope of the appended claims.

What is claimed is:

1. A semiconductor package comprising:

a single layer board having oppositely facing first and second main surfaces;

a plurality of connection pads and a corresponding plurality of circuit wires on the first main surface, each of the circuit wires extending from a connection pad to a connection end, the circuit wires being disposed in a region of the first main surface;

a semiconductor chip mounted on the first main surface and having input/output terminals aligned with and connected to the connection pads, the semiconductor chip being located over the circuit wires in the region of the first main surface;

a plurality of flat external connector terminals exposed on the second main surface of said board, said external connector terminals being arrayed at constant pitch in a rectangular grid; and a filled via hole connection extending vertically from each of said external connector terminals and electrically connected to the connection end of each of said circuit wires, respectively;

whereby each of said input/output terminals is connected by one of said circuit wires to one of said external connector terminals.

2. A semiconductor package as set forth in claim 1, wherein the circuit wires are approximately flush with the main surface of the board, and including a resin layer filled between the single layer board and the semiconductor chip.

3. A semiconductor package as set forth in claim 1, wherein the circuit wires are in a wiring circuit region and including a dummy pattern installed for reinforcing the edges of the board enclosing said wiring circuit region.

4. A semiconductor package as set forth in claim 1 including dummy connector terminals in addition to said external connector terminals.

* * * * *

UNITED STATES PATENT AND TRADEMARK OFFICE
CERTIFICATE OF CORRECTION

PATENT NO. : 5,773,882
DATED : June 30, 1998
INVENTOR(S) : Hiroshi IWASAKI

It is certified that error appears in the above-identified patent and that said Letters Patent is hereby corrected as shown below:

On the Title Page, item [57], line 2 of Abstract, delete "wiped".

Signed and Sealed this

Sixth Day of April, 1999

Attest:

Attesting Officer

Q. TODD DICKINSON

Acting Commissioner of Patents and Trademarks